US006921969B2

(12) United States Patent
Knapp

(10) Patent No.: US 6,921,969 B2
(45) Date of Patent: Jul. 26, 2005

(54) SEMICONDUCTOR MODULE AND METHOD OF PRODUCING A SEMICONDUCTOR MODULE

(75) Inventor: Wolfgang Knapp, Lenzburg (CH)

(73) Assignee: ABB Research Ltd., Zurich (CH)

( * ) Notice: Subject to any disclaimer, the term of this patent is extended or adjusted under 35 U.S.C. 154(b) by 210 days.

(21) Appl. No.: 10/315,086

(22) Filed: Dec. 10, 2002

(65) Prior Publication Data

US 2003/0116839 A1 Jun. 26, 2003

(30) Foreign Application Priority Data

Dec. 24, 2001 (EP) ............................................ 01811271

(51) Int. Cl.⁷ .............................................. H01L 23/06
(52) U.S. Cl. ........................ 257/704; 257/705; 257/706
(58) Field of Search ................................. 257/704, 705, 257/706, 712, 713, 717, 720, 718

(56) References Cited

U.S. PATENT DOCUMENTS

| | | | |
|---|---|---|---|
| 5,529,959 A | | 6/1996 | Yamanaka |
| 5,532,517 A | | 7/1996 | Kawamoto |
| 5,705,431 A | * | 1/1998 | Mori ........................ 438/123 |
| 5,789,270 A | | 8/1998 | Jeng et al. |
| 5,801,073 A | * | 9/1998 | Robbins et al. ............. 438/125 |
| 5,801,074 A | * | 9/1998 | Kim et al. ................. 438/125 |
| 5,834,840 A | * | 11/1998 | Robbins et al. ............. 257/705 |
| 5,924,190 A | * | 7/1999 | Lee et al. ..................... 29/827 |
| 5,942,794 A | * | 8/1999 | Okumura et al. ........... 257/666 |
| 5,943,558 A | * | 8/1999 | Kim et al. .................. 438/125 |
| 6,130,115 A | * | 10/2000 | Okumura et al. ........... 438/124 |
| 6,274,927 B1 | * | 8/2001 | Glenn ........................ 257/680 |
| RE37,413 E | * | 10/2001 | Cha ............................ 438/124 |
| 6,326,244 B1 | * | 12/2001 | Brooks et al. .............. 438/124 |
| 6,384,472 B1 | * | 5/2002 | Huang ........................ 257/680 |
| 6,420,204 B2 | * | 7/2002 | Glenn .......................... 438/64 |

FOREIGN PATENT DOCUMENTS

| | | |
|---|---|---|
| DE | 19959248 A1 | 6/2001 |
| EP | 0661748 A1 | 7/1995 |
| EP | 0921565 A2 | 6/1999 |
| EP | 1041626 A2 | 10/2000 |
| GB | 2196178 | 4/1988 |

OTHER PUBLICATIONS

R. Zehringer, et al., "Material Requirements for High Voltage, High Power IGBT Devices", Mat. Res. Soc. Symp. Proc. vol. 483, Materials Research Society, 1998, pp. 369–380.

* cited by examiner

Primary Examiner—Laura M Schillinger
(74) Attorney, Agent, or Firm—Burns, Doane, Swecker & Mathis LLP

(57) ABSTRACT

The semiconductor module comprises a base element (1), an insulating element (2), which is metallized on both sides and rests on the base element by one of the two metallizations, and at least one semiconductor element (6) arranged on the other of the two metallizations. An electrically insulating layer (51) is arranged in the edge region of the insulating element (2), the surface of this insulating layer forming a common planar surface with the surface of the second metallization. The blunting of the edges and corners of the metallization by level embedding of the entire metallized insulating element improves the insulating property of semiconductor module in the area of the critical electrical field region. Moreover, the arrangement in one plane permits simple and low-cost production.

10 Claims, 2 Drawing Sheets

SEMICONDUCTOR MODULE AND METHOD OF PRODUCING A SEMICONDUCTOR MODULE

This application claims priority under 35 U.S.C. §§ 119 and/or 365 to Appln. No. 01811271.4 filed in Europe on Dec. 24, 2001; the entire content of which is hereby incorporated by reference.

FIELD OF THE INVENTION

The invention concerns the field of power electronics. It relates to a semiconductor module according to the precharacterizing clause of patent claim 1 and to a method of producing a semiconductor module according to the precharacterizing clause of patent claim 7.

BACKGROUND OF THE INVENTION

A semiconductor module of this type is known for example from R. Zehringer et al., *"Power Semiconductor Materials and Devices", Materials Research Society Symposium Proceedings*, Volume 483, 1998, pages 369–380. This publication describes a semiconductor module with a module housing, a metallic base plate and a plurality of semiconductor elements, in this case IGBT (Insulated Gate Bipolar Transistor) chips and diodes, arranged on said base plate and covered by said module housing. The module housing is generally filled with a silicone gel composition, which serves as an electrical insulating layer and as corrosion protection and also reduces tensile forces acting on connecting wires. The base plate is connected to a water cooling arrangement, to dissipate the heat generated by the semiconductor elements. Arranged on the base plate is a substrate in the form of a metal-coated ceramic board. It has an electrical insulation between the semiconductor elements and the base plate or water cooling arrangement and, moreover, has good thermal conductivity, to dissipate the heat of the semiconductor elements to the base plate. The base plate, ceramic board and semiconductor elements are soldered on one another, the metal layers of the ceramic board permitting the soldered connection.

Good thermal conductivity and poor electrical conductivity can nowadays be combined in materials, so that there is no difficulty in producing insulating elements which are relatively thin but conduct heat well, for example from aluminum nitride (AlN), with a good electrical insulating capacity. For instance, a thickness of 1.5 to 2 mm is theoretically adequate to insulate 20 kV.

Edge effects, caused in particular by edges and corners of the metal layers, adversely affect the dielectric strength of the semiconductor module, however, in particular in the case of high-power semiconductor modules above 1.2 kV. The edges and corners of the metal layers have an inhomogeneous, intensified electric field. This excessive field increase leads to partial discharges and limits the dielectric strength of the entire construction. In this case, the field strength at the edges is at least the square of the voltage, with the result that massively thicker electrical insulation would be necessary to avoid such partial discharges. Air bubbles that may be produced precisely in the edge zones when gel is filled into the module housing are conducive to partial discharges and constitute an additional critical factor with regard to the functionality of the semiconductor module.

There are various approaches to solving this insulation problem. In DE 199 59 248, clearances are formed in field-critical regions and filled with gel, consequently forming an additional interface which prevents the spread of discharges. In EP 1 041 626, the field is reduced in critical regions by three-dimensional rounded portions in the substrate. Both solutions are complex and expensive to produce.

SUMMARY OF THE INVENTION

It is therefore an object of the invention to provide a semiconductor module of the type stated at the beginning which has an improved dielectric strength and at the same time is simple to produce. Furthermore, it is an object of the invention to provide a simplified and more reliable method of producing a semiconductor module of the type stated at the beginning.

The objects are achieved by a semiconductor module with the features of patent claim 1 and by a method with the features of patent claim 7.

The semiconductor module according to the invention with a base element, at least one insulating element, which rests on the base element by a first of two metallizations arranged on opposite surfaces of the insulating element, and with at least one semiconductor element arranged on the second of the two metallizations, is distinguished by the fact that an electrically insulating layer is arranged in the edge region of the insulating element, and that the surface of the insulating layer forms a common planar surface with the surface of the second metallization.

The blunting of the edges and corners of the metallization by level embedding of the entire metallized insulating element improves the insulating property of the semiconductor module in the area of the critical electrical field region. By comparison with conventional semiconductor modules filled with silicone gel, a considerable improvement is obtained with respect to the electrical insulation, while retaining the advantages of the flat, metallized insulating element, in particular the good thermal conductivity and the low production costs.

For the contacting of the semiconductor elements, contacting elements are recessed into the insulating layer, the contact elements being electrically insulated both from the second metallization and from the base element by the insulating layer. The contacting elements have contacting areas, which form a common planar surface with the surfaces of the insulating layer and of the second metallization.

The fact that all the other major parts of the semiconductor module form a common planar surface simplifies the processing and mounting of the semiconductor elements.

In a second embodiment of the semiconductor module according to the invention, a depression in which the insulating element is arranged is recessed into the surface of the base element. The second metallization of the insulating element is electrically insulated from the base element by the insulating layer. The surfaces of the insulating element, of the second metallization and of the base element form a common planar surface.

In this embodiment, semiconductor elements or other electronic components can be arranged next to one another and electrically insulated from one another both on the second metallization and on the base element itself. In particular in what are known as press-pack modules, in which semiconductor elements which can be contacted on two sides are contacted by means of a contact stamp and subjected to pressing force, this produces interesting possibilities. For example, two semiconductor elements arranged next to each other can be electrically connected in series without the geometry of the respective contact stamps having to be adapted.

For the press-pack modules, the common surface of the second metallization of the insulating element and of the insulating layer saves a method step in production. Since conventional standard substrates, which are preferably used as the insulating element, do not satisfy the flatness requirements for use in a press-pack module, they must be machined, for example by milling. The precision milling can be carried out in one step during the production of the semiconductor module according to the invention, together with the milling away of the insulating layer and the preparation of the contacting areas.

In the case of the method according to the invention of producing a semiconductor module, at least one insulating element is attached on a base element or in a surface depression of the base element by a first of two metallizations arranged on opposite surfaces of the insulating element. Semiconductor elements are attached on the second metallization and/or, if the insulating element is arranged in a depression, on the surface of the base element, and main terminals and/or control terminals of the semiconductor elements are contacted by wire connections or other electrical conductors and connected to contacting areas of contacting elements.

The semiconductor module according to the invention is distinguished by the fact that, before the semiconductor elements are attached, the base element and the at least one insulating element are introduced together with the contacting elements into a casting mold, an insulating layer is formed by filling the volume of the casting mold not taken up by the base element, insulating element or contacting element with an electrically insulating material and by the insulating layer subsequently being cured and sufficient material removed from the cured insulating layer that the surface of the insulating layer forms a common planar surface with the surface of the second of the two metallizations, with contacting areas of the contacting elements and, if the insulating element is arranged in a depression, with the surface of the base element; and that, after the semiconductor elements have been attached, movable contacting pieces of the contacting elements are arranged upright, perpendicularly in relation to the surface of the insulating layer.

The application of the insulating layer and the corresponding removal to the common surface before the semiconductor elements are attached makes it possible for the entire semiconductor module to be tested with respect to the electrical insulating strength before the semiconductor elements are attached and contacted in a complex and cost-intensive method step. The number of ready-fitted semiconductor modules with defect-free insulation can be significantly reduced as a result.

In an additional advantageous step of the method according to the invention, the casting mold can be at least partially evacuated before filling with the electrically insulating material. This improves the structure of the insulating layer, in particular allowing the formation of air bubbles, which may be conducive to electrical discharges, to be avoided.

BRIEF DESCRIPTION OF THE DRAWINGS

The invention is subsequently explained in more detail on the basis of preferred exemplary embodiments in conjunction with the drawings, in which.

Identical designations relate to equivalent parts.

DETAILED DESCRIPTION OF THE INVENTION

The production method according to the invention is explained on the basis of FIGS. 1 to 4, which show a first exemplary embodiment of a semiconductor module according to the invention.

In a first method step, an insulating element 2 is attached on a base element 1. The insulating element is advantageously a substrate which is metallized on two sides and comprises, for example, an $AlO_3$ or AlN ceramic board provided with copper or aluminum metallization. The material of the base element, for example Mo, AlSiC or aluminum graphite or copper graphite, is advantageously adapted with respect to thermal expansion to the material of the insulating element. The insulating element 2 is attached by a first metallization 21 directly on the base element, for example by means of a soldered connection or what is known as low-temperature bonding (LTB). The second metallization 22 may comprise a plurality of regions electrically insulated from one another.

Figure 1:
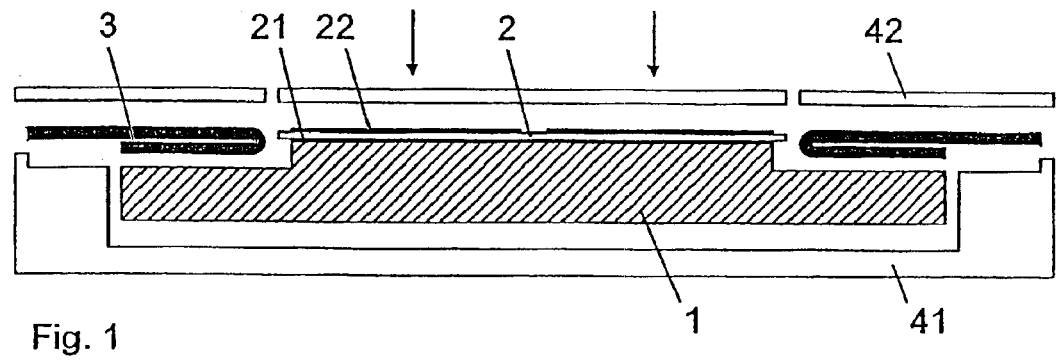
FIG. 1 shows a simplified sectional view of a first exemplary embodiment of a semiconductor module according to the invention before the module is introduced into a casting mold for applying an insulating layer.

Contacting elements 3 for contacting the semiconductor elements are provided in recesses of the base element 1 which are intended for this purpose. To this end, the base element 1, insulating element 2 and contacting elements 3 are introduced into a trough-shaped casting mold 41, which is represented in FIG. 1. The contacting elements 3 are in this case positioned and aligned in relation to the base element 1 by corresponding guiding elements. The casting mold 41 is closed by a second casting mold part 42.

Figure 2:
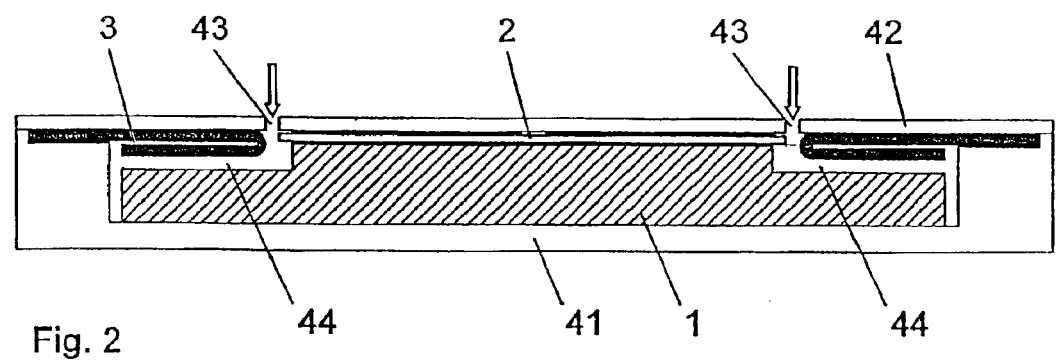
FIG. 2 shows the semiconductor module according to FIG. 1 in the casting mold when applying the insulating layer.

In FIG. 2, an electrically insulating material 51 is subsequently poured (arrows) into a cavity 44 in the interior of the casting mold through openings 43 made in the casting mold. The cavity 44 corresponds to the interior volume of the casting mold not filled by the base element 1, insulating element 2 and contacting elements 3. However, the cavity 44 mainly extends to a region between the contacting elements 3 and the base element 1. The material of this electrically insulating layer 51 produced in this way is advantageously a readily flowing plastic which cures well and in the cured state can be heated for a short time to above 220° C. without greatly deforming. This is important in particular in the case of those semiconductor modules in which semiconductor elements are soldered onto the metallization of the insulating element. Furthermore, the plastic should have a coefficient of thermal expansion which corresponds to that of the surrounding materials. Corresponding plastics are, for example, epoxies available under the trade names Stycast or Aratherm. These substances lie with the breakdown voltage approximately in the range of the silicone gel used in conventional semiconductor modules, but have considerably improved adhesion and a higher dielectric constant, reducing the electric field correspondingly. For semiconductor modules without soldered-on semiconductor elements, for example in press-pack modules, lower-cost materials can also be used, for example pourable polyurethanes, which are widely used for insulations in the interior area. For applications without great requirements in respect of mechanical rigidity, silicone rubber may be used. This withstands much higher temperatures and, moreover, has excellent adhesion on most materials, in particular in combination with what are known as primers. To reduce the coefficient of expansion and increase the thermal conductivity, casting resin fillers are mixed with the material of the insulating layer to up to over 50% of the casting composition.

To facilitate the casting operation, and in particular ensure the homogeneity of the insulating layer 51, the casting mold is advantageously evacuated before the casting. In this case, the air is sucked out of the interior of the casting mold through the openings 43 or other openings especially intended for this purpose. Processing under vacuum allows the formation of air bubbles in the interior of the insulating layer 51 to be prevented. Air bubbles may be conducive to the production of discharges.

Following the casting operation, the semiconductor module is removed from the casting mold. The insulating layer 51 is cured to the extent that it can be mechanically worked. The insulating layer 51 is removed to a common surface with the surface of the second metallization 22 in one working step, for example by grinding. Contacting areas 31 of the contacting elements 3 likewise lie in this plane. The surfaces on which a wire or an electrode of a semiconductor element are subsequently attached, in particular the contacting areas 31 and the surface of the second metallization 22, must be correspondingly pretreated.

It is necessary in this case to remove from the insulating layer 51 in particular the casting skin which is unavoidably produced during casting and contains casting composition penetrating between the component and the casting mold, and may be very thin, for example a few mm, depending on the contact pressure and nature of the surface of the parts.

Thanks to the arrangement in one plane, the surface preparation of the contacting areas 31, of the second metallization 22 and of the insulating layer 51 can be performed together, in one mold and in one working step. As a result, the processing costs can be reduced considerably.

Moreover, the absolutely flat working surface allows surface changes to be subsequently made in a simple way, for example the improvement or conservation of the contacting areas 31.

Figure 3:
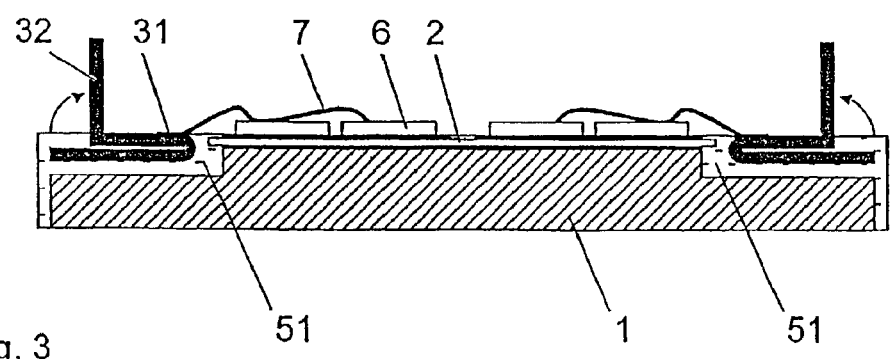
FIG. 3 shows the semiconductor module according to FIG. 2 with the insulating layer applied.

The flat working surface is likewise conducive for the next method step according to FIG. 3, the application of the semiconductor elements 6 on the second metallization 22. The semiconductor elements 6 are, for example, soldered onto the metallization or attached by means of low-temperature bonding.

The semiconductor elements 6 are subsequently connected in an electrically conducting manner to one another and to the contacting areas 31. For example by means of simple contacting wire connections 7.

The contacting elements 3, which until this point in time have been of a substantially flat form, are subsequently bent in such a way that a contacting piece 32 protrudes perpendicularly in relation to the surface of the insulating layer 51. The contacting elements 3 are correspondingly prepared, with a predetermined bending point which separates the region of the contacting areas 31 from the contacting piece. The contacting elements are produced from metal sheet and their size and thickness are adapted to the currents to be conducted. As can be seen from the figures, the contacting element comprises a lower region which is folded under an upper region. The upper region comprises a contacting area 31 and contacting piece 32. Since only the upper region lies on the current path, the lower region serves as a field-shielding means. The corners and edges of the contacting elements, in particular of the lower region, are advantageously rounded, to avoid excessive field increases. The lower region is mechanically isolated from the upper region; the region of the fold is free from mechanical stress which could have adverse effects on the insulating layer, or its insulating property. Even when the contacting piece 32 is raised, this dielectrically critical region is not impaired. If the contacting elements are punched from metal sheet, for example from silver-plated copper sheet, a slightly rounded surface is obtained by the punching, and, with appropriate arrangement of the metal sheet with the rounding on the outside, said surface can contribute to reducing the electric field in the region of the folding.

Figure 4:
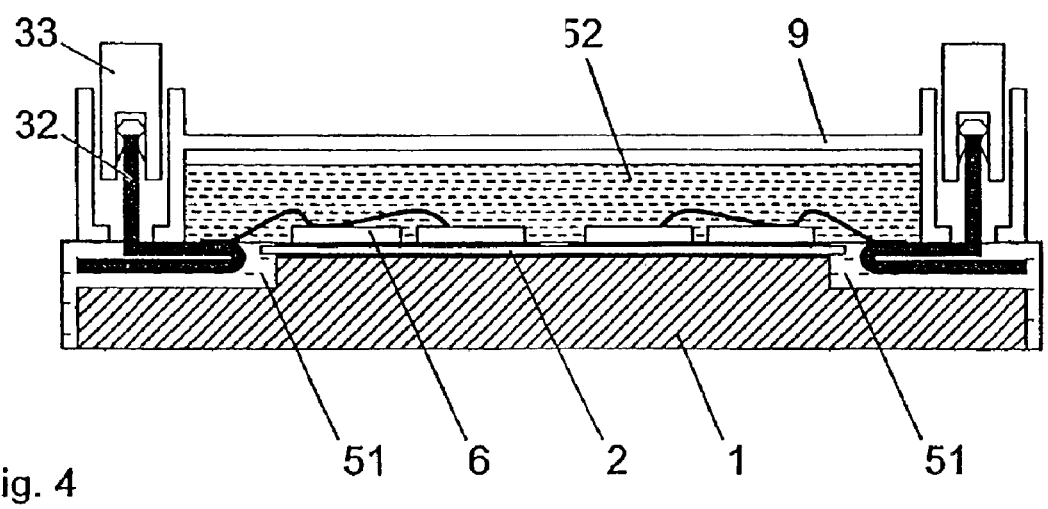
FIG. 4 shows the ready-to-mount semiconductor module according to FIG. 3.

The semiconductor module is subsequently provided with a housing cover 9, which is represented in FIG. 4. Moreover, the cavity in the interior of the housing is filled with a silicone gel 52 as in the case of customary semiconductor modules.

The perpendicularly protruding contacting pieces 32, which are led out of the semiconductor module through the housing cover 9, are contacted by means of contacting connectors 33.

Figure 5:
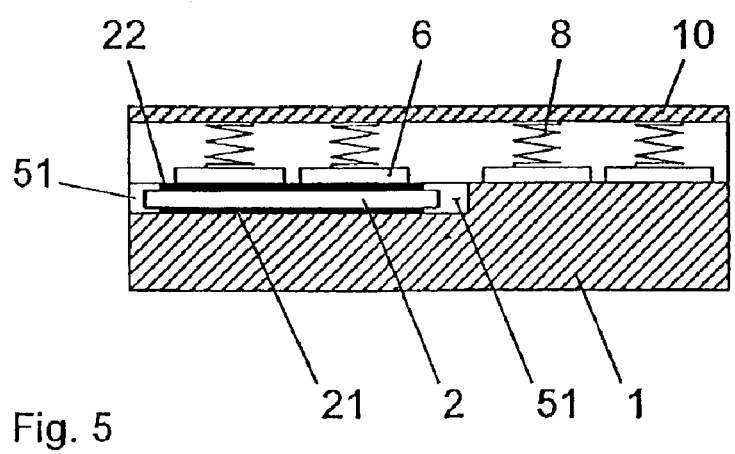
FIG. 5 shows a simplified sectional view of a second exemplary embodiment of a semiconductor module according to the invention.

To produce a semiconductor module according to the invention in a second embodiment according to FIG. 5, the same method according to the invention is applied.

In this case, in the first step, the insulating element 2 is arranged in a depression in the base element 1 and attached to the base element.

Subsequently, the base element 1 and the insulating element 2, with or without contacting elements, are introduced into the casting mold and corresponding cavities between the base element and the insulating element are filled with electrically insulating material.

As represented in FIG. 5, the surfaces of the second metallization 22, of the base element 1 and of the insulating layer 51 are in a common plane. Since conventional standard substrates which are preferably used as the insulating element do not satisfy the flatness requirements for use in a press-pack module, they must be machined, for example by milling or grinding. Thanks to the arrangement with a common surface, the precision milling can be carried out together with the milling away of the insulating layer in one step during the production of the semiconductor module according to the invention. Apart from facilitating the mounting of the semiconductor elements, as already mentioned, this arrangement also makes it possible to use one and the same contact stamps 8, which comprise contact springs and provide sufficient pressing force on the semiconductor elements 6.

List of Designations

1 base element
2 insulating element, substrate
21, 22 metallizations
3 contacting element
31 contacting area
32 contacting piece
33 contacting connector
41, 42 casting mold
43 inlet openings 44 cavity
51 insulating layer
52 insulating gel
6 semiconductor elements, chip
7 contacting wires
8 contact stamp
9 housing
10 cover plate

What is claimed is:

1. A semiconductor module comprising:
   a base element,
   at least one insulating element including upper and lower surfaces on opposite sides and a first metallization on the lower surface and a second metallization on the upper surface, said insulating element being attached to said base element by the first metallization on the lower surface, and
   at least one semiconductor element arranged on the second metallization on the upper surface of the insulating element,
   wherein
   an electrically insulating layer is arranged surrounding the insulating element, and wherein
   the surface of the insulating layer forms a common planar surface with the surface of the second metallization on the upper surface of the insulating element.

2. The semiconductor module as claimed in claim 1, wherein
   for the contacting of the at least one semiconductor element, at least one contacting element is recessed into the insulating layer, the contact element being electrically insulated from the metallizations and the base element by the insulating layer, and wherein
   the contacting element has a contactable area, which forms a common planar surface with the surface of the insulating layer and the surface of the second metallization.

3. The semiconductor module as claimed in claim 2, wherein
   the contacting element comprises a movable contacting piece, wherein
   in the preassembled state, the surface of the contacting piece lies in a plane with the surface of the insulating layer, and wherein
   in the preassembled state, the contacting piece is substantially perpendicular in relation to the surface of the insulating layer.

4. The semiconductor module as claimed in claim 1, wherein
   the base element has a surface depression, wherein
   the insulating element is arranged in the depression, the second metallization being electrically insulated from the base element by the insulating layer, and wherein
   the surface of the insulating layer forms a common planar surface with the surface of the second metallization and the surface of the base element.

5. The semiconductor module as claimed in claim 4, wherein
   at least one semiconductor element is arranged on the surface of the base element.

6. The semiconductor module as claimed in claim 1, wherein
   the insulating layer consists of a material which can be heated for a few seconds, to above 200° C., without deforming.

7. The semiconductor module as claimed in claim 1, wherein the semiconductor module is a power semiconductor module.

8. The semiconductor module as claimed in claim 6, wherein
   the insulating layer consists of a material which can be heated for 5 to 10 seconds, to above 200° C., without deforming.

9. The semiconductor module as claimed in claim 6, wherein
   the insulating layer consists of a material which can be heated for a few seconds to above 220° C., without deforming.

10. The semiconductor module as claimed in claim 9, wherein
    the insulating layer consists of a material which can be heated for 5 to 10 few seconds to above 220° C., without deforming.

* * * * *